(12) United States Patent
Fujimori

(10) Patent No.: US 11,539,380 B2
(45) Date of Patent: Dec. 27, 2022

(54) DECODING DEVICE, DECODING METHOD, CONTROL CIRCUIT, AND STORAGE MEDIUM

(71) Applicant: MITSUBISHI ELECTRIC CORPORATION, Tokyo (JP)

(72) Inventor: Takafumi Fujimori, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 17/382,736

(22) Filed: Jul. 22, 2021

(65) Prior Publication Data

US 2021/0351796 A1 Nov. 11, 2021

Related U.S. Application Data

(63) Continuation of application No. PCT/JP2019/010938, filed on Mar. 15, 2019.

(51) Int. Cl.
*H03M 13/37* (2006.01)
*H03M 13/13* (2006.01)
*H03M 13/45* (2006.01)

(52) U.S. Cl.
CPC ....... *H03M 13/3707* (2013.01); *H03M 13/13* (2013.01); *H03M 13/45* (2013.01)

(58) Field of Classification Search
CPC ... H03M 13/3707; H03M 13/13; H03M 13/45
See application file for complete search history.

(56) References Cited

U.S. PATENT DOCUMENTS 10,270,470 B2 4/2019 Li et al.
10,790,857 B1* 9/2020 Nguyen ............ H03M 13/2906
(Continued)

FOREIGN PATENT DOCUMENTS

JP 6075812 B2 2/2017

OTHER PUBLICATIONS

Erdal Arikan, "Channel Polarization: A Method for Constructing Capacity-Achieving Codes for Symmetric Binary-Input Memoryless Channels", IEEE Transactions on Information Theory, vol. 55, No. 7. Jul. 2009, p. 3051-3073.

(Continued)

*Primary Examiner* — Thien Nguyen
(74) *Attorney, Agent, or Firm* — Birch, Stewart, Kolasch & Birch, LLP

(57) ABSTRACT

A decoding device includes: a hard decision decoder generating a first decoding result by performing hard decision decoding of a polar code using an input signal, and generating a first error detection result by performing first error detection processing on the first decoding result; a soft decision decoder generating a second decoding result by performing successive decoding of a polar code on the input signal, obtained for each decoding step in the successive decoding, and generating a second error detection result by performing second error detection processing on a result obtained by updating the first decoding result using the second decoding result; a data selector selecting and outputting either the first decoding result or the result obtained by updating the first decoding result using the second decoding result; and a controller stopping the soft decision decoder when the data selector outputs the final decoding result.

14 Claims, 7 Drawing Sheets

(56) References Cited

U.S. PATENT DOCUMENTS

| | | | |
|---|---|---|---|
| 2002/0016156 A1* | 2/2002 | Ogino | H03M 13/15 455/134 |
| 2010/0246724 A1* | 9/2010 | Park | G06K 19/0723 375/340 |
| 2014/0310580 A1* | 10/2014 | Zhang | H03M 13/3746 714/780 |
| 2014/0365842 A1 | 12/2014 | Li et al. | |
| 2015/0263760 A1* | 9/2015 | Hof | H03M 13/1108 714/758 |
| 2018/0006667 A1* | 1/2018 | Motwani | H04L 1/0057 |
| 2018/0062668 A1 | 3/2018 | Moon et al. | |
| 2018/0219561 A1 | 8/2018 | Litsyn et al. | |

OTHER PUBLICATIONS

Kim et al., "A Fast Successive Cancellation List Decoder for Polar Codes With an Early Stopping Criterion", IEEE Transactions on Signal Processing, vol. 66, No. 18, Aug. 13, 2018, p. 4971-4979.
Notification of Reasons for Refusal issued in the corresponding JP App. No. 2021-506815 dated Jun. 15, 2021.
Xiong et al., "Symbol-Decision Successive Cancellation List Decoder for Polar Codes", IEEE Transactions on Signal Processing, vol. 64, No. 3, Feb. 1, 2016, p. 675-687.

* cited by examiner

DECODING DEVICE, DECODING METHOD, CONTROL CIRCUIT, AND STORAGE MEDIUM

CROSS-REFERENCE TO RELATED APPLICATION

This application is a continuation application of International Application PCT/JP2019/010938, filed on Mar. 15, 2019, and designating the U.S., the entire contents of which are incorporated herein by reference.

BACKGROUND OF THE INVENTION

1. Field of the Invention

The present disclosure relates to a decoding device and a decoding method for decoding a polar-coded signal, and also relates to a control circuit and a storage medium therefor.

2. Description of the Related Art

Error correction technique is generally used in a communication process to address some error that may occur due to noise and the like caused in a communication channel. Polar code that is one form of error-correcting codes can offer performance asymptotically approaching the Shannon limit based on a concept of channel polarization (see E. Arikan, "Channel Polarization: A Method for Constructing Capacity-Achieving Codes for Symmetric Binary-Input Memoryless Channels", IEEE Transactions on Information Theory, vol. 55, no. 7, pp. 3051-3073, July 2009. Hereinafter called Non-Patent Literature 1). Use of the polar code can also reduce the amount of computation in encoding and decoding. A polar code is a block code, which is subjected to repetition of an exclusive OR operation and a combination change on bits within a block, thereby this block being polar-coded.

For decoding a polar-coded signal, use is generally made of a successive cancellation decoding method in which bets are sequentially determined. In successive cancellation decoding method, a longer code length requires a longer time for decoding. Japanese Patent No. 6075812 discloses a technique in which a range in which successive decoding is applied is divided into multiple divisions, successive decoding is performed on a group of divisions obtained by the division so as to get multiple results, and further post-processing is applied to the multiple results using an exclusive OR operation or the like. The technique described in Japanese Patent No. 6075812 enables successive decoding to be performed on the divisional group of divisions in parallel, and can therefore reduce a processing time required for the decoding.

However, the technique described in Japanese Patent No. 6075812 listed above can indeed reduce a processing time required for decoding by virtue of the division, but a fundamental decoding method relies on successive decoding, and thereby the total amount of decoding operation remains high. A high total amount of operation leads to frequent processing, thereby power consumption increasing, or requiring use of a high performance circuit by which power consumption increases.

The present disclosure has been made in view of the foregoing circumstances, and it is an object of the present disclosure to provide a decoding device that can reduce the total amount of decoding operation.

SUMMARY OF THE INVENTION

In order to solve the above-mentioned problem and achieve the object, the present disclosure provides a decoding device comprising: a hard decision decoder to generate a first decoding result by performing hard decision decoding of a polar code using an input signal, and to generate a first error detection result by performing first error detection processing on the first decoding result; a soft decision decoder to generate a second decoding result by performing successive decoding of a polar code on the input signal, the second decoding result being obtained for each decoding step in the successive decoding, and to generate a second error detection result by performing second error detection processing on a result obtained by updating the first decoding result using the second decoding result; a data selector to select either the first decoding result or the result obtained by updating the first decoding result using the second decoding result, and to output a selection result as a final decoding result; and a controller to stop the soft decision decoder when the data selector outputs the final decoding result.

DETAILED DESCRIPTION OF THE PREFERRED EMBODIMENTS

A decoding device and a decoding method according to embodiments of the present disclosure will be described in detail with reference to the drawings.

First Embodiment

Figure 1:
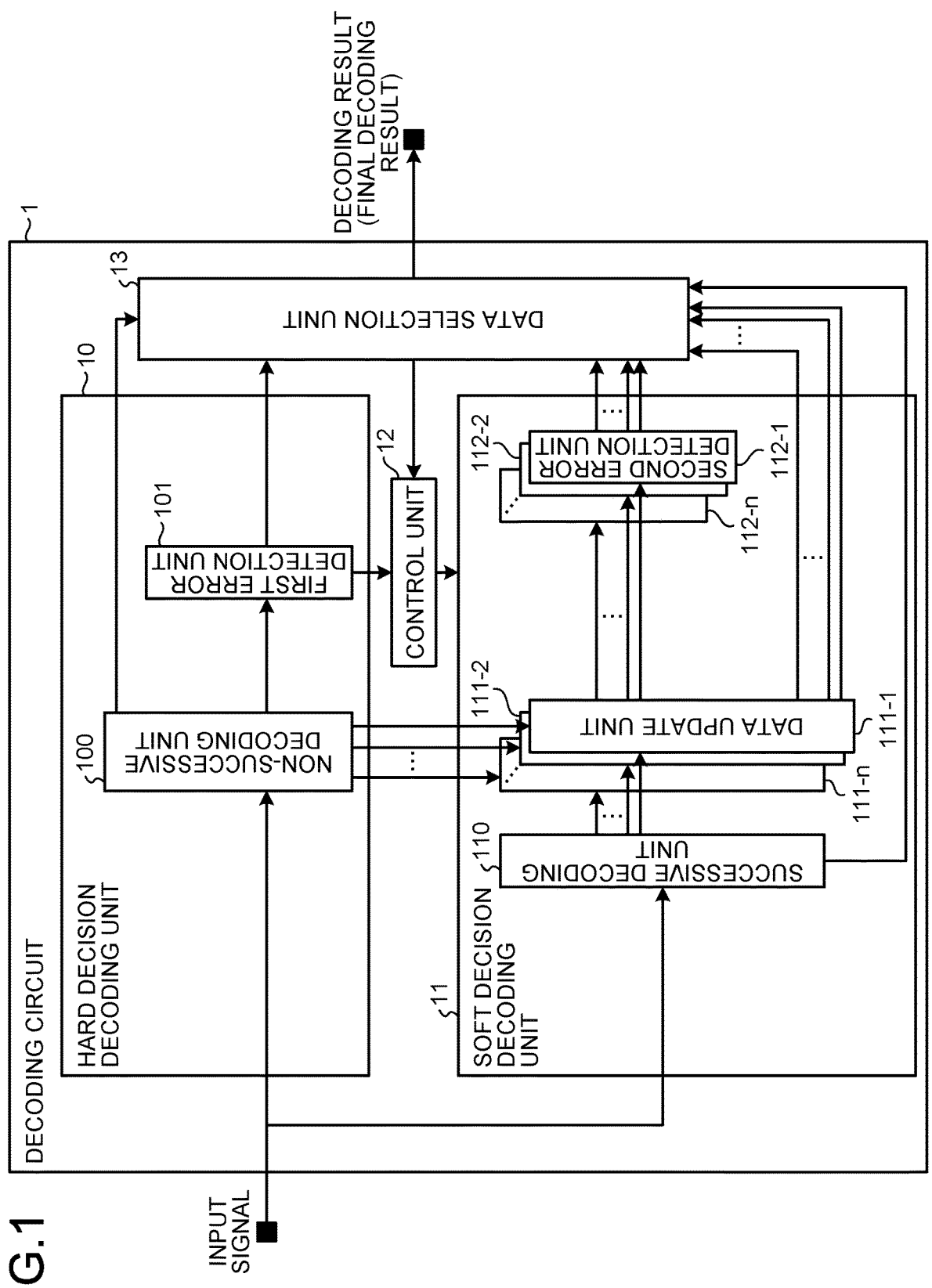
FIG. 1 is a diagram illustrating an example configuration of a decoding circuit according to a first embodiment.

FIG. 1 is a diagram illustrating an example configuration of a decoding circuit according to a first embodiment of the present disclosure. A decoding circuit 1 illustrated in FIG. 1 is an example of a decoding device according to the present disclosure. The decoding circuit 1 decodes a signal inputted therein, and outputs a result obtained by the decoding to a downstream circuit not illustrated. Note that, as described later, the decoding circuit 1 also calculates a decoding result that is an intermediate result in the process of successive decoding. A decoding result as the intermediate result and a decoding result to be outputted to a downstream circuit are both a decoding result, of which a decoding result to be outputted to a downstream circuit is hereinafter referred to as final decoding result. The downstream circuit is, for example, a circuit for removing a redundancy bit in a case in which the decoding circuit 1 outputs a decoding result after adding a redundancy bit to the decoding result; a decoding circuit for outer code in a case in which a concatenated coding scheme is applied for performing error correction in coordination with polar codes; or a de-interleave circuit in a case in which outer codes and polar codes are interleaved. Alternatively, the downstream circuit may be a deframer circuit or the like in a case in which the decoding device 1 transfers a signal from another transmission-reception device into another frame and a transmission-reception device equipped with the decoding device 1 transmits the signal, or may be a polar coding circuit or the like in a case in which the decoding circuit 1 is a repeater designed to cover decoding for error correction. Further alternatively, the downstream circuit may be a circuit that executes an application that operates using transmitted information in a case in which the decoding circuit 1 is a circuit on a final stage in reception processing of a reception signal. The downstream circuit is not limited to the foregoing examples.

The input signal inputted to the decoding circuit 1 corresponds to, for example, a reception signal that has been received as a result of a polar-coded signal through a communication channel; a log likelihood ratio (LLR); or the like. The decoding circuit 1 is, for example, equipped in a reception device. This reception device receives, from a transmission device, a signal that has been polar-coded in the transmission device. Note that in a case in which the input signal inputted to the decoding circuit 1 is an LLR, a circuit upstream of the decoding circuit 1 in the reception device calculates the LLR, and inputs the LLR into the decoding circuit 1. In a case in which the input signal is a reception signal, the upstream circuit is an analog-to-digital (AD) conversion circuit or the like.

As illustrated in FIG. 1, the decoding circuit 1 includes a hard decision decoding unit or decoder 10, a soft decision decoding unit or decoder 11, a control unit or controller 12, and a data selection unit or selector 13. The hard decision decoding unit 10 generates a first decoding result by performing hard decision decoding of polar codes using an input signal, and generates a first error detection result by performing error detection processing on the first decoding result. The processing performed by the hard decision decoding unit 10 is also referred to as first processing. The soft decision decoding unit 11 generates a second decoding result obtained for each decoding step in the successive decoding by performing successive decoding of polar codes on the input signal, updates the first decoding result using the second decoding result, and generates a second error detection result by performing error detection processing on the result obtained by the updating. The processing performed by the soft decision decoding unit 11 is also referred to as second processing. The data selection unit 13 selects either the first decoding result or the result obtained by updating of the first decoding result using the second decoding result, and outputs the selection result as the final decoding result. The control unit 12 starts up the soft decision decoding unit 11 based on the first error detection result, and stops the soft decision decoding unit 11 when the data selection unit 13 outputs the final decoding result. More specifically, the data selection unit 13 provides the control unit 12 with notification of control information indicating that a decoding result has been determined upon outputting of the final decoding result, and the control unit 12 stops the soft decision decoding unit 11 upon reception of this notification.

The hard decision decoding unit 10 includes a non-successive decoding unit or decoder 100 and a first error detection unit or detector 101. In addition, the soft decision decoding unit 11 includes a successive decoding unit or decoder 110, data update units or circuits 111-1 to 111-n, and second error detection units or detectors 112-1 to 112-n, where n is an integer representing the number of the data update units and of the second error detection units, and, for example, corresponds to the number of lists in a list type successive cancellation list decoding as described later. The example of FIG. 1 assumes that n is greater than or equal to three. However, the value of n is not limited to the value in this example, and may be any number greater than or equal to one.

Polar code will now be described. Polar code is used in an error-correcting code scheme proposed by Arikan in 2008. As described in Non-Patent Literature 1, polar code offers performance asymptotically approaching the Shannon limit based on a concept of channel polarization. Encoding of polar codes is provided by repeating logical connection with an exclusive OR operation on bits in a block. In addition, in general, when polar codes are used, a fixed value called as frozen bit or freeze bit, which is known to both the transmission device and the reception device, is added to information bits before encoding, and then encoding for polar codes is performed on the information bits to which the fixed value has been added. This fixed value called as frozen bit or freeze bit is hereinafter also referred to simply as fixed value. The fixed value is inserted at a predetermined position relative to the information bits to be encoded. In a polar coding scheme, bits in one block are assigned to different communication channels in compliance with channel polarization. The channel capacity differs between communication channels. Unless a particular restriction exists, a typical manner is to insert a fixed value starting with a part having the lowest channel capacity in calculation of the channel capacity before the encoding. In this calculation of the channel capacity, calculation of the channel capacity is performed on a certain bit using a determined result of a bit value for one bit of two bits to be exclusive-OR'ed. Thus, the polar code is a code based on an assumption of successively decoding two bits to be exclusive-OR'ed.

Accordingly, one conceivable method for decoding polar codes is to successively determine a bit with use of soft decision information such as probability of occurrence, likelihood, or an LLR, using the reception signal and a bit determined in the process of decoding. Examples of typical decoding method include successive cancellation decoding (SCD), successive cancellation list decoding (SCLD), and successive cancellation list decoding (CRC aided SCLD) that uses cyclic redundancy check (CRC) in determination of a decoding result. In addition, as far as the channel capacity before encoding is concerned, a longer length of code leads to clearer separation between a position at which a channel capacity is satisfactory and a position at which a channel capacity is poor, and therefore a longer length of code enables more effective use of the polar codes. However, since decoding of polar codes uses successive decoding that involves successive determination of bits, a long length of code results in a high amount of operation in the decoding processing. As described below, the present embodiment uses successive decoding and non-successive decoding with hard decision in combination to reduce the amount of operation on average.

The present embodiment is based on the assumption that the transmission device adds a frozen bit before encoding of polar codes, and adds a redundancy bit for error detection through error detection coding processing. Any error detection coding processing scheme may be used, examples of which include techniques such as forward error correction (FEC), parity code (parity check) such as vertical redundancy check (VRC) or longitudinal redundancy check (LRC), a check sum, and a cyclic redundancy check. Note that the error detection coding processing scheme is not limited to the foregoing examples, but any method may be used as long as it can detect an error.

Returning to the description with reference to FIG. 1, the non-successive decoding unit 100 of the hard decision decoding unit 10 generates a hard decision value based on a soft decision value or an LLR obtained from the reception signal, performs hard decision decoding by performing non-successive decoding of polar codes using the hard decision value, and outputs a decoding result to the first error detection unit 101, to the data selection unit 13, and to the data update units 111-1 to 111-$n$. The hard decision value may be generated using a general method, which may be any applicable method. A circuit configured for non-successive decoding of polar codes may be a circuit used together with a polar coding circuit configured to encode polar codes, or may be a circuit dedicated to decoding of polar codes.

The first error detection unit 101 performs error detection processing using the redundancy bit for error detection added before the encoding, using the decoding result outputted from the non-successive decoding unit 100, and outputs the result of error detection processing to the control unit 12 and to the data selection unit 13.

The soft decision decoding unit 11 performs successive decoding of polar codes on the input signal inputted to the decoding circuit 1. The successive decoding unit 110 of the soft decision decoding unit 11 is a decoding unit that performs successive decoding using the input signal and a decoding result obtained in the process of the decoding operation of the successive decoding unit 110. The successive decoding unit 110 may use a typical decoding method such as a successive cancellation decoding method or a successive cancellation list decoding method. Note that the successive decoding unit 110 outputs, at a timing of the completion of decoding, a decoding result that is a result of successive decoding obtained in the process of the decoding operation based on the successive cancellation decoding or successive cancellation list decoding, to the data update units 111-1 to 111-$n$. The successive decoding unit 110 also outputs, to the data selection unit 13, information for selecting the most probable candidate, obtained during decoding of the successive cancellation list decoding. Information indicating the most probable candidate is information representing likeliness for each candidate, i.e., each decoding result, examples of which include a path metric.

Note that the successive decoding unit 110 may use any decoding method other than the successive cancellation decoding and successive cancellation list decoding as long as it performs successive decoding. In a case in which the input signal is a reception signal, the successive decoding unit 110 may generate an LLR using the input signal to perform successive decoding using the LLR, or may perform successive decoding using likelihood or probability using the input signal. In a case in which the input signal is an LLR, the successive decoding unit 110 can perform successive decoding using the LLR.

Note that FIG. 1 illustrates, by way of example, an example to which successive cancellation list decoding is applied. Accordingly, the soft decision decoding unit 11 includes the data update units 111-1 to 111-$n$ and the second error detection units 112-1 to 112-$n$ as many as the maximum number of lists, which are provided downstream of the successive decoding unit 110. A relationship of n=L holds, where L represents the maximum number of lists. Note that the parallel number of data update units 111-1 to 111-$n$ and of second error detection units 112-1 to 112-$n$ may also be provided on the assumption that the maximum number of lists is made variable. In this case, for example, a relationship of n>L is set, so as to make it possible to adapt to change in the maximum number of lists L.

Although FIG. 1 illustrates, by way of example, an example to which successive cancellation list decoding is applied with the number of lists being greater than or equal to three, the soft decision decoding unit 11 only has to include the data update unit 111-1 and the second error detection unit 112-1 in a case where successive cancellation list decoding is applied with the number of lists being one. In a case in which the successive decoding unit 110 uses successive cancellation decoding as a decoding method, the soft decision decoding unit 11 only has to include the data update unit 111-1 and the second error detection unit 112-1 similarly to the case where successive cancellation list decoding is applied with the number of lists being one. For this reason, the configuration illustrated in FIG. 1 is applicable to both the case of using successive cancellation list decoding and the case of using successive cancellation decoding. That is, FIG. 1 is a diagram encompassing both the typical successive decoding methods. Another successive decoding method can also be used by modifying the configuration of the soft decision decoding unit 11 according to that successive decoding method.

The data update units 111-1 to 111-$n$ each hold the decoding result of the non-successive decoding unit 100 of the hard decision decoding unit 10, and overwrite and thus update a decoding result held therein with a decoding result inputted from the successive decoding unit 110, i.e., the decoding result successively generated by successive decoding of the successive decoding unit 110. As described later, the data update units 111-1 to 111-$n$ update data even before the successive decoding unit 110 completes successive decoding of all of the bits for the length of code, that is, even when the successive decoding unit 110 have performed successive decoding on only some bits of all of the bits for the length of code. For this reason, the decoding results held by the data update units 111-1 to 111-$n$ after the updating are each based on: the first decoding result, i.e., the decoding result of the non-successive decoding unit 100 of the hard decision decoding unit 10; and the second decoding result, i.e., the decoding result of the successive decoding unit 110. The data update units 111-1 to 111-$n$ output the updated decoding results to the second error detection units 112-1 to 112-$n$, respectively. The data update units 111-1 to 111-$n$ also output the updated decoding results to the data selection unit 13. Note that the data update units 111-1 to 111-$n$ receive their respective different signals inputted therein, but operate in the same manner, and can thus use the same type of circuits. Since the data update units 111-1 to 111-$n$ correspond to lists in the successive cancellation list decoding, respectively, the units 111-1 to 111-$n$ operate similarly to one another despite different decoding results inputted from the successive decoding unit 110.

The second error detection units 112-1 to 112-$n$ perform error detection processing on the decoding results respectively updated by the data update units 111-1 to 111-$n$ similarly to the first error detection unit 101, and output error detection results to the data selection unit 13. The same type of circuits can be used for the first error detection unit 101 and the second error detection units 112-1 to 112-$n$.

According to the operation described above, the soft decision decoding unit 11 outputs, to the data selection unit 13, as many decoding results as the number of lists updated by the data update units 111-1 to 111-$n$, the error detection results obtained by the second error detection units 112-1 to 112-$n$, and information for selecting the most probable candidate outputted from the successive decoding unit 110.

The control unit 12 controls the soft decision decoding unit 11 based on the error detection result inputted from the first error detection unit 101 of the hard decision decoding unit 10 and control information, described later, inputted from the data selection unit 13. Specifically, in a case in which the error detection result inputted from the first error detection unit 101 is a result indicating occurrence of an error, the control unit 12 starts up the soft decision decoding unit 11. Alternatively, when information indicating that a decoding result has been determined as control information is inputted from the data selection unit 13, the control unit 12 stops the soft decision decoding unit 11.

The data selection unit 13 generates control information based on pieces of information inputted from the hard decision decoding unit 10 and pieces of information inputted from the soft decision decoding unit 11, and outputs the control information to the control unit 12. In addition, the data selection unit 13 selects a decoding result to be used as the final decoding result based on pieces of information inputted from the hard decision decoding unit 10 and pieces of information inputted from the soft decision decoding unit 11, and outputs the final decoding result to a circuit, not illustrated, downstream of the decoding circuit 1.

More specifically, when the error detection result inputted from the first error detection unit 101 is a result indicating absence of error, the data selection unit 13 selects the decoding result outputted from the non-successive decoding unit 100 of the hard decision decoding unit 10, and outputs that decoding result as the final decoding result. When the error detection result inputted from the first error detection unit 101 is a result indicating absence of error, the soft decision decoding unit 11 does not operate, and the final decoding result is established. In a case in which the error detection result inputted from the first error detection unit 101 is a result indicating presence of an error, the soft decision decoding unit 11 is caused to operate. When the error detection result inputted from the first error detection unit 101 is a result indicating presence of an error, the data selection unit 13 selects a decoding result to be used as the final decoding result, with use of the information inputted from the soft decision decoding unit 11, and outputs the final decoding result. In this operation, the data selection unit 13 receives information from the soft decision decoding unit 11 even before the completion of successive decoding of all of the bits, and when an error-free decoding result is obtained, the data selection unit 13 establishes that decoding result as the final decoding result even when successive decoding is not yet completed for all of the bits. Specifically, the data selection unit 13 selects, from the decoding results inputted from the data update units 111-1 to 111-$n$, one indicating that a corresponding one of the error detection results inputted from the second error detection units 112-1 to 112-$n$ has no error. The decoding results inputted from the data update units 111-1 to 111-$n$ are either those obtained by updating the decoding result of non-successive decoding with the decoding results of successive decoding before the completion for all of the bits for the number of lists, or those obtained by updating the decoding result of non-successive decoding with the decoding results of successive decoding at the time of completion for all of the bits for the number of lists. For example, when the decoding result inputted from the second error detection unit 112-2 indicates absence of error, the data selection unit 13 selects the decoding result inputted from the data update unit 111-2, and outputs that decoding result as the final decoding result.

On the other hand, when all of the error detection results inputted from the second error detection units 112-1 to 112-$n$ indicate presence of an error even after successive decoding is completed for all of the bits, the data selection unit 13 selects the most probable decoding result from the decoding results inputted from the data update units 111-1 to 111-$n$, using the information for selecting the most probable candidate inputted from the successive decoding unit 110, and outputs the most probable decoding result as the final decoding result. For example, in a case in which the information for selecting the most probable candidate is a path metric, the data selection unit 13 selects the decoding result having the smallest path metric. When two or more results indicating no error exist among the error detection results inputted from the second error detection units 112-1 to 112-$n$, the data selection unit 13 may select the most probable decoding result with use of the information for selecting the most probable candidate, inputted from the successive decoding unit 110.

Figure 2:
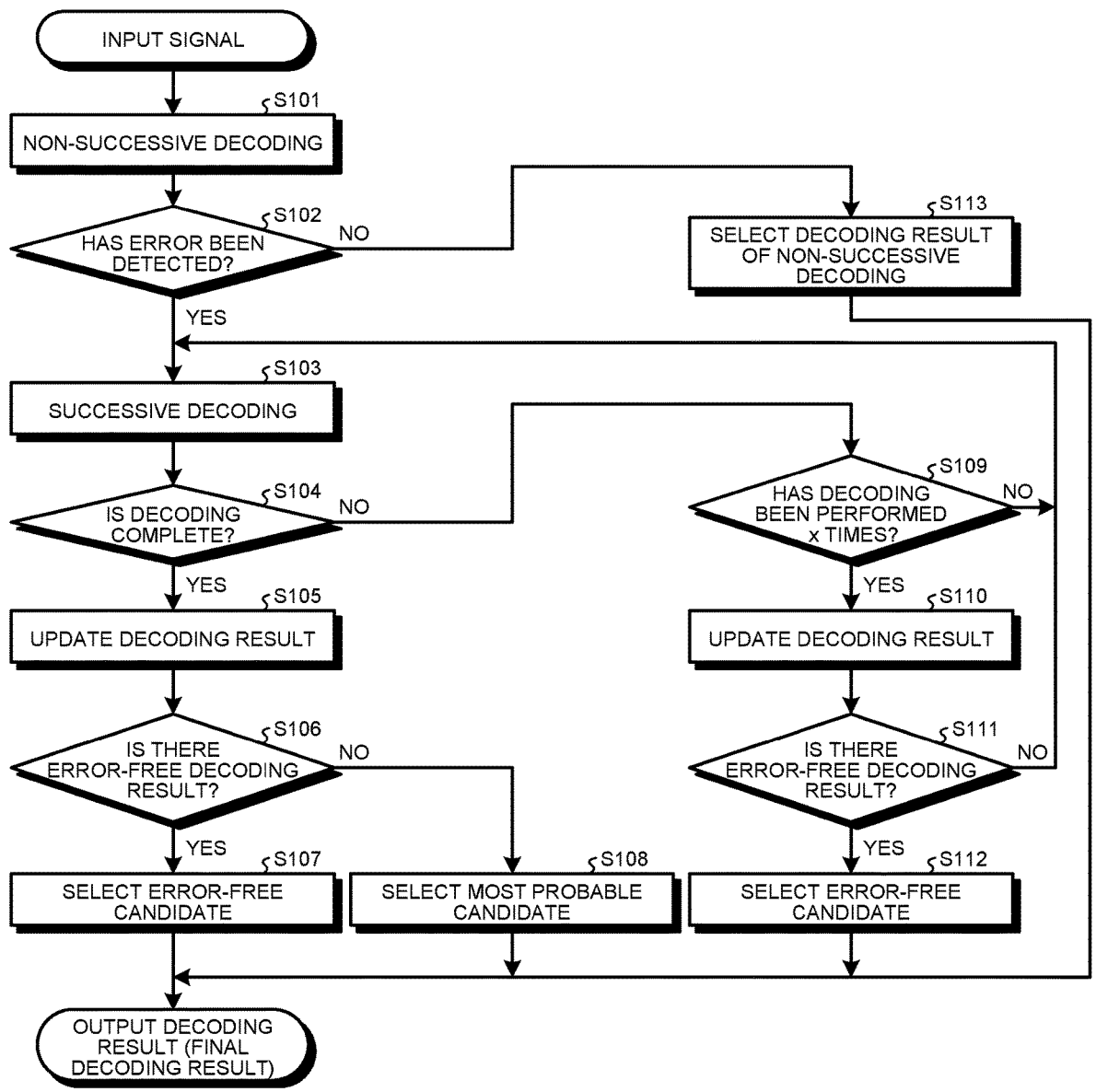
FIG. 2 is a flowchart illustrating an example of processing procedure in the decoding circuit of the first embodiment.

An operation of the decoding circuit 1 of the present embodiment will next be described with reference to a flowchart. FIG. 2 is a flowchart illustrating an example of processing procedure in the decoding circuit 1 of the present embodiment. A case will be described below as an example in which successive cancellation list decoding is used as a successive decoding method. Note that the following description is based on the assumption that the decoding circuit 1 having a configuration illustrated in FIG. 1 performs the process illustrated in FIG. 2, but the process may be performed by a decoding circuit having a configuration other than the configuration illustrated in FIG. 1 as long as it can perform the process illustrated in FIG. 2. In addition, the processing procedure illustrated in FIG. 2 is merely an example of the processing procedure in the decoding circuit 1, and the processing procedure in the decoding circuit 1 is not limited to the example illustrated in FIG. 2 as long as it is a processing procedure that can obtain an equivalent result.

First, when an input signal is inputted into the decoding circuit 1, the non-successive decoding unit 100 of the hard decision decoding unit 10 performs non-successive decoding (step S101). As described above, the non-successive decoding unit 100 outputs a decoding result to the first error detection unit 101, and the first error detection unit 101 performs error detection processing, and outputs an error detection result to the data selection unit 13 and to the control unit 12. The data selection unit 13 determines whether or not an error has been detected based on the error detection result (step S102). If no error has been detected (No at step S102), the data selection unit 13 selects the decoding result inputted from the non-successive decoding unit 100, i.e., the decoding result of non-successive decoding, as the final decoding result (step S113). The data selection unit 13 then outputs the final decoding result. Upon completion of the determination of the decoding result, that is, upon outputting of the final decoding result, the data selection unit 13 provides the control unit 12 with notification, as control information, of information indicating that the decoding result has been determined. Upon reception of this notification, the control unit 12 stops the soft decision decoding unit 11.

If the error detection result inputted from the first error detection unit 101 indicates that an error has been detected (Yes at step S102), the successive decoding unit 110 performs successive decoding (step S103). Specifically, this may be conducted such that the data selection unit 13 provides the control unit 12 with notification that an error has been detected, as control information, and upon reception of the notification, the control unit 12 instructs the successive decoding unit 110 of the soft decision decoding unit 11 to start processing, or may be conducted such that the control unit 12 makes the determination based on the error detection result inputted from the first error detection unit 101 to instruct the successive decoding unit 110 to start processing. Note that although an example will be described below in which the soft decision decoding unit 11 is caused to operate when the error detection result from the first error detection unit 101 indicates that an error has been detected, the hard decision decoding unit 10 and the soft decision decoding unit 11 may be simultaneously caused to operate to perform processing in parallel. In this case, processing in the hard decision decoding unit 10 ends earlier than processing in the soft decision decoding unit 11, and therefore, only the soft decision decoding unit 11 needs to be stopped if no error has been detected during the error detection of the first error detection unit 101.

The successive decoding unit 110 generates as many decoding results as the number of lists in successive decoding, and generates pieces of information for selecting the most probable candidate as many in number as the lists. The successive decoding unit 110 outputs as many decoding results as the number of lists to the data update units 111-1 to 111-*n*, respectively and outputs the pieces of information for selecting the most probable candidate as many in number as the lists, to the data selection unit 13.

The successive decoding unit 110 determines whether the decoding is completed, i.e., whether or not the decoding has been performed for the length of code (step S104). If the decoding is completed (Yes at step S104), the successive decoding unit 110 instructs the data update units 111-1 through 111-*n* to update the decoding results, and the data update units 111-1 to 111-*n* update the decoding results (step S105). Specifically, the data update units 111-1 to 111-*n* overwrite the respective decoding results held therein, with the decoding results inputted from the successive decoding unit 110 to thereby update the decoding results. The data update units 111-1 to 111-*n* output the updated decoding results to the second error detection units 112-1 to 112-*n*, respectively. The second error detection units 112-1 to 112-*n* perform error detection processing on the inputted decoding results, and output error detection results to the data selection unit 13.

The data selection unit 13 determines whether or not there is an error-free decoding result among those obtained by updating the decoding result of the non-successive decoding unit 100 with the decoding results of the successive decoding unit 110, on the basis of the error detection results inputted from the second error detection units 112-1 to 112-*n* (step S106). If there is an error-free decoding result (Yes at step S106), the data selection unit 13 selects, as the final decoding result, the error-free candidate, i.e., the decoding result determined to be error-free in the error detection results, from among the decoding results inputted from the data update units 111-1 to 111-*n* (step S107), and outputs the final decoding result. That is, in a case in which the soft decision decoding unit 11 performs successive cancellation list decoding as the successive decoding, the soft decision decoding unit 11 generates decoding results obtained by updating the first decoding result with the second decoding results for each list, and the second error detection results, and the data selection unit 13 selects, based on the second error detection results, a decoding result obtained by updating the first decoding result with one of the second decoding results, from the decoding results obtained by updating the first decoding result with the second decoding results for each list, and outputs the decoding result selected.

If there is no error-free decoding result (No at step S106), the data selection unit 13 selects a likely candidate as the final decoding result based on the information for selecting the most probable candidate inputted from the successive decoding unit 110 (step S108), and outputs the likely candidate as the final decoding result. For example, in a case in which the information for selecting the most probable candidate is a path metric, the likely candidate is, as described above, the decoding result having the smallest path metric. That is, if there is no result indicating absence of error among the second error detection results, the data selection unit 13 selects, based on information representing likeliness, a decoding result obtained by updating the first decoding result with one of the second decoding results, from among the decoding results obtained by updating the first decoding result with the second decoding results for each of the lists, and outputs the decoding result selected.

If the decoding is not yet completed at step S104 (No at step S104), the successive decoding unit 110 determines whether or not the decoding has been performed x times (step S109). The process on or after this determination of whether or not the decoding has been performed x times is one of the features of the present embodiment. The number x is a preset natural number, which is any value less than the length of code. Otherwise, in a case in which, in performing successive decoding, the successive decoding unit 110 performs, not successive decoding processing on a per-bit basis, but decoding processing in which polar code decoding is performed on multiple bits together at one time, such as successive decoding on a per-symbol basis or non-binary polar code decoding, the number x can be any value less than N/s, where N represents the length of code, and s represents the number of bits processed at one time. The successive decoding unit 110 counts the number of executions of decoding of the successive decoding unit 110 every codeword, i.e., every input signal. Then, if the successive decoding unit 110 has performed the decoding less than x times, that is, if the decoding has not been yet x times (No at step S109), the successive decoding unit 110 executes the process from step S103 again.

Meanwhile, if the decoding has been performed x times (Yes at step S109), the successive decoding unit 110 instructs the data update units 111-1 through 111-*n* to update the decoding results, and the data update units 111-1 to 111-*n* update the result of non-successive decoding (step S110). The data update units 111-1 to 111-*n* output the updated decoding results to the second error detection units 112-1 to 112-*n*, respectively. The second error detection units 112-1 to 112-*n* perform error detection processing on the respective decoding results that have been inputted therein, and output error detection results to the data selection unit 13.

The data selection unit 13 determines whether or not there is an error-free decoding result among the decoding results of the successive decoding unit 110 based on the error detection results inputted from the second error detection units 112-1 to 112-*n* (step S111). If there is an error-free decoding result (Yes at step S111), the data selection unit 13 selects, as the final decoding result, the error-free candidate, i.e., a decoding result determined to be error-free in the error detection results, from among the decoding results inputted from the data update units 111-1 to 111-$n$ (step S112), and outputs the final decoding result.

If there is no error-free decoding result (No at step S111), the successive decoding unit 110 resets the counter that indicates the number of times of successive decoding, and carries out the process from step S103 again.

As described above, the decoding circuit of the present embodiment updates the decoding result (S110) and determines whether or not there is an error-free decoding result (S111) at the end of x times of the successive decoding before the completion of successive decoding for the length of code, and if an error-free decoding result is obtained, decoding processing is terminated. This can reduce the amount of operation for the decoding processing, and can thus reduce the operational rate of the decoding circuit 1. Reduction in the operational rate of the decoding circuit 1 can in turn reduce electric power consumption.

Note that the present embodiment has been described in which the soft decision decoding unit 11 counts the number of times of decoding in the successive decoding, and the soft decision decoding unit 11 performs second error detection processing using the second error detection units 112-1 to 112-$n$ when the counted number of times has reached the number x. However, whether the decoding has been performed x times is merely an example of decision criterion, and the second error detection processing may be performed at any timing before the completion of the successive decoding for the length of code. That is, it is sufficient that the soft decision decoding unit 11 performs the second error detection processing before successive decoding is performed for the length of code, and the data selection unit 13 determines whether or not the second error detection result is a result indicating absence of error, and if the second error detection result is a result indicating absence of error, the unit 13 selects and outputs the decoding result obtained by updating the first decoding result with the second decoding result corresponding to that second error detection result. Then, when the data selection unit 13 selects and outputs the decoding result obtained by updating the first decoding result with the second decoding result, the control unit 12 receives, from the data selection unit 13, control information indicating that the decoding result has been determined, and in response to this reception, stops the soft decision decoding unit 11. As described above, it is sufficient that the soft decision decoding unit 11 can be stopped in the middle of the successive decoding on the basis of the second error detection results. For example, as described above, what is added to information before encoding of polar codes is a fixed value called as frozen bit or freeze bit being added thereto. In a case in which a redundancy bit has been added to the information bits in the error detection coding processing before encoding of polar codes, decoding of the fixed value will not alter the detection result of error detection. In this case therefore, the counted number of times of x may exclude the number of times of decoding for the fixed value. In addition, the number x may be set to be changeable from a fixed value to a variable depending on a transmission condition. There is no limitation to this example, and any criterion may be set for intermediate steps before the completion of successive decoding for the length of code, depending on the circuit configuration. Note that the processing procedure illustrated in FIG. 2 is also applicable to even the case in which a redundancy bit for error detection is added to the combination of information bits and a fixed value, and to even the case in which a redundancy bit for error detection is added to a fixed value.

Note that the non-successive decoding at step S101 provides lower correction capability than successive decoding of soft decision because of decoding using a hard decision value, but it can be implemented using one-to-one operation according to a hard decision value, and so it can be implemented with simpler processing than the successive decoding. For example, under a communication condition that is good enough not to require successive decoding, the decoding circuit 1 can output the final decoding result through a process of step S101, step S102, and step S113, thereby making it possible to reduce the operational rate of the decoding circuit 1. In addition, by applying soft decision successive decoding that provides a higher correction capability than the hard decision decoding processing when the determination at step S102 indicates presence of an error, the decoding circuit 1 is applicable even to an environment of unsatisfactory communication condition.

A general method for decoding polar codes requires processing to be continued until the successive decoding for the length of code completes, which has been unable to reduce the operational rate of the decoding circuit. In the present embodiment, first performing non-successive decoding with low processing load, though with lower correction capability, enables the decoding to be completed in simpler processing when successive decoding is not needed. In addition, the data update units 111-1 to 111-$n$ overwrite the decoding results held therein, with the decoding results including intermediate results of successive decoding, and output the update results to the second error detection units 112-1 to 112-$n$. This enables error detection processing to be performed even in the process of the successive decoding. Moreover, as described above, by abandoning the successive decoding when it is determined that there is no error at step S111, the operational rate of the decoding circuit 1 can be reduced.

Figure 3:
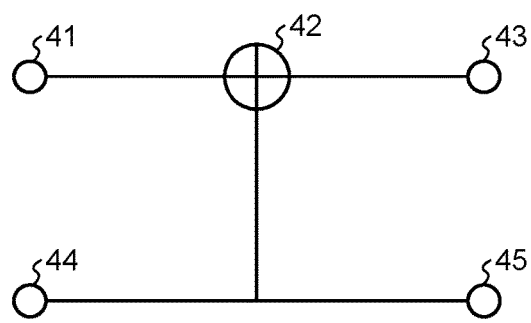
FIG. 3 is a diagram illustrating a concept of an exclusive OR operation of the first embodiment.

Note that the decoding circuit of the present embodiment uses a feature of a polar code to thereby effectively reduce the amount of operation. A two-bit exclusive OR (XOR: eXclusive OR) used in part of encoding and decoding of polar codes will now be described. FIG. 3 is a diagram illustrating a concept of an exclusive OR operation of the present embodiment. Pre-encoding bits 41 and 44 that are each a bit before being encoded in the encoding of polar codes are inputs of an exclusive OR operation circuit 42, and post-encoding bits 43 and 45 are outputs of the exclusive OR operation. In this example, the pre-encoding bit 41 is processed such that the pre-encoding bit 41 is decoded using an LLR, a likelihood, a probability, or the like corresponding to the positions of the post-encoding bit 43 and the post-encoding bit 45. Then, the pre-encoding bit 44 is decoded using the decoding result of the pre-encoding bit 41 and the LLR, the likelihood, the probability, or the like corresponding to the positions of the post-encoding bit 43 and the post-encoding bit 45. For this process, the later one to be subjected to the successive decoding, i.e., the pre-encoding bit 44 in this example, tends to have a higher LLR, likelihood, probability, or the like.

In addition, the fixed value called frozen bit, freeze bit, or the like is placed sequentially, as described above, in general, starting with the position having the lowest channel capacity before encoding. Although this fixed value has no particular order, an earlier one in the decoding process tends to be fixed earlier. These indicate a property that, unlike other error correction techniques in which error is caused at random, a polar code decoded earlier is more likely to lead to error. This property supports, in principle, a tendency that error correction completes in the process of the decoding of successive decoding described above. The decoding circuit of the present embodiment takes advantage of such a property of polar codes to reduce the amount of operation.

Note that the process of steps S105 to S108 when the determination results in Yes at step S104 is similar to that in a general successive cancellation list decoding method. Therefore, in essentials, the present embodiment causes no degradation of decoding performance similarly to the general successive cancellation list decoding method. In addition, when the number of lists for the successive cancellation list decoding is set to one, it is equivalent to the successive cancellation decoding, and therefore the processing procedure of FIG. 2 is also applicable to a case of using the successive cancellation decoding method. Moreover, when the number of lists is 1, the process of steps S105 to S108 and S112 of FIG. 2 may be omitted.

Figure 4:
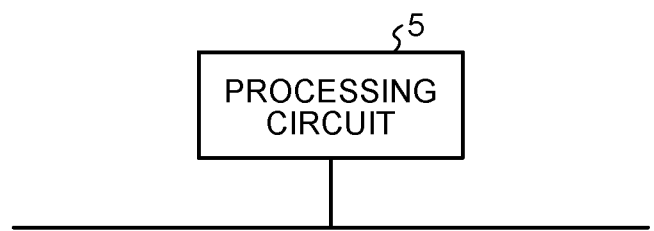
FIG. 4 is a diagram illustrating a processing circuit that is dedicated hardware of the first embodiment.

Hardware for implementing the decoding circuit 1 of the present embodiment will next be described. The units constituting each of the hard decision decoding unit 10 and the soft decision decoding unit 11, the control unit 12, and the data selection unit 13 of the decoding circuit 1 can be implemented by a processing circuit that is a dedicated hardware set. FIG. 4 is a diagram illustrating a processing circuit that is a dedicated hardware component of the present embodiment. The units constituting each of the hard decision decoding unit 10 and the soft decision decoding unit 11, the control unit 12, and the data selection unit 13 of the decoding circuit 1 are implemented, for example, by a processing circuit 5 illustrated in FIG. 4.

The processing circuit 5 may be, for example, a single circuit, a composite circuit, a programmed processor, a parallel programmed processor, an application specific integrated circuit (ASIC), a field programmable gate array (FPGA), or any combination thereof. The functions of the units constituting each of the hard decision decoding unit 10 and the soft decision decoding unit 11, the control unit 12, and the data selection unit 13 of the decoding circuit 1 may each be implemented by their respective different processing circuits, or all or some of the functions of these units may be collectively implemented by one or more processing circuits.

Figure 5:
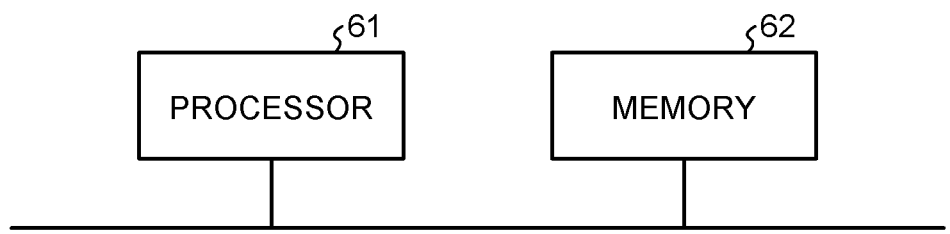
FIG. 5 is a diagram illustrating an example of a control circuit of the first embodiment.

The processing circuit configured to implement the units constituting each of the hard decision decoding unit 10 and the soft decision decoding unit 11, the control unit 12, and the data selection unit 13 of the decoding circuit 1 may be a control circuit equipped with a processor. FIG. 5 is a diagram illustrating an example of the control circuit of the present embodiment. As illustrated in FIG. 5, the control circuit includes a processor 61 and a memory 62. In a case in which the functions of the units constituting each of the hard decision decoding unit 10 and the soft decision decoding unit 11, the control unit 12, and the data selection unit 13 of the decoding circuit 1 are implemented in the control circuit illustrated in FIG. 5, these functions can be implemented in software, firmware, or a combination of software and firmware. The software and firmware are described as a program or programs, and are stored in the memory 62. The functions of the units constituting each of the hard decision decoding unit 10 and the soft decision decoding unit 11, the control unit 12, and the data selection unit 13 of the decoding circuit 1 are implemented by the processor 61 reading programs from the memory 62, and executing the programs. It can also be said that these programs cause a computer to perform a procedure and a method performed by the units constituting each of the hard decision decoding unit 10 and the soft decision decoding unit 11, the control unit 12, and the data selection unit 13 of the decoding circuit 1. These programs may be provided from a recording medium or by a communication medium.

In this regard, the memory 62 may be: for example, a non-volatile or volatile semiconductor memory such as a random access memory (RAN), a read-only memory (ROM), a flash memory, an erasable programmable read-only memory (EPROM), or an electrically erasable programmable read-only memory (EEPROM) (registered trademark); a magnetic disk; a flexible disk; an optical disk; a compact disc; a MiniDisc; a digital versatile disk (DVD); or the like.

In a case in which the functions of the units constituting each of the hard decision decoding unit 10 and the soft decision decoding unit 11, the control unit 12, and the data selection unit 13 of the decoding circuit 1 are implemented by a control circuit, the program stored in the memory 62 is a program by which a decoding method including a first through fourth steps is performed as a result. The first step is a step of performing a first process to generate a first decoding result by performing hard decision decoding of a polar code using an input signal, and to generate a first error detection result by performing error detection processing on the first decoding result. The second step is a step of performing a second process to generate a second decoding result by performing successive decoding of a polar code on the input signal, the second decoding result being obtained for each decoding step in the successive decoding, and to generate a second error detection result by performing error detection processing using a decoding result obtained by updating the first decoding result with the second decoding result. The third step is a step of selecting either the first decoding result or the decoding result obtained by updating the first decoding result with the second decoding result, and outputting the selection result as the final decoding result. The fourth step is a step of stopping the second process when the final decoding result has been outputted in the third step.

Note that functions of the units constituting each of the hard decision decoding unit 10 and the soft decision decoding unit 11, the control unit 12, and the data selection unit 13 of the decoding circuit 1 may be implemented partially in dedicated hardware and partially in software or firmware for the remainder. For example, the configuration may be adopted such that the functions of the hard decision decoding unit 10, the successive decoding unit 110, the second error detection units 112-1 to 112-n, and the control unit 12 are implemented by the processing circuit 5 that is a dedicated hardware set, illustrated in FIG. 4, while the functions of the data update units 111-1 to 111-n and the data selection unit 13 are implemented by the control circuit illustrated in FIG. 5. As described above, the decoding circuit 1 can be implemented in dedicated hardware, software, firmware, or a combination thereof.

Second Embodiment

Figure 6:
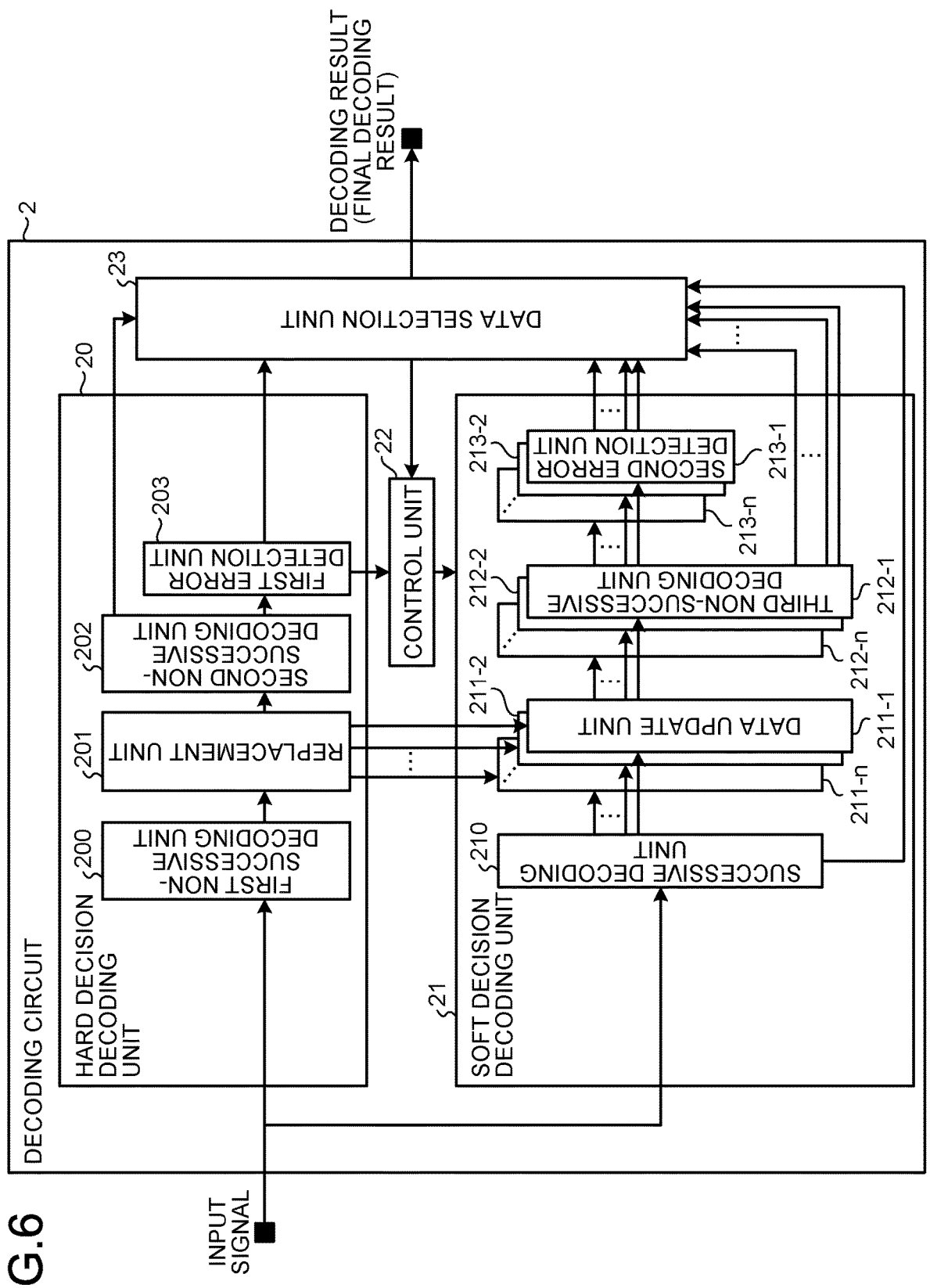
FIG. 6 is a diagram illustrating an example configuration of a decoding circuit according to a second embodiment.

FIG. 6 is a diagram illustrating an example configuration of a decoding circuit according to a second embodiment of the present disclosure. As illustrated in FIG. 6, a decoding circuit 2 is an example of a decoding device according to the present disclosure. Similarly to the decoding circuit 1 of the first embodiment, the decoding circuit 2 decodes a signal inputted therein, and outputs a result obtained by the decoding to a downstream circuit not illustrated. Note that also in the present embodiment, a decoding result to be outputted to the downstream circuit is called as final decoding result. Redundant description of the same parts as those of the first embodiment will be omitted below, and differences from the first embodiment will primarily be described.

In the present embodiment, encoding is performed on systematic polar codes to which a redundancy bit has been added in the transmission device, the redundancy bit being used to execute error detection. A systematic polar code is a polar code that allows separation of the information bits and the redundancy bit resulting from the polar coding. Similarly to the manner of the first embodiment, the transmission device adds, to the information bits, a fixed value called as frozen bit or freeze bit, which is a fixed value known to both the transmission device and the reception device, before encoding of systematic polar codes. The input signal inputted to the decoding circuit 2 may be a soft decision value of a reception signal transmitted from the transmission device and received by the reception device, or may be an LLR generated from the reception signal.

As illustrated in FIG. 6, the decoding circuit 2 includes a hard decision decoding unit or decoder 20, a soft decision decoding unit or decoder 21, a control unit or controller 22, and a data selection unit or selector 23. The hard decision decoding unit 20 includes a first non-successive decoding unit or decoder 200, a replacement unit or circuit 201, a second non-successive decoding unit or decoder 202, and a first error detection unit or decoder 203. In addition, the soft decision decoding unit 21 includes a successive decoding unit or decoder 210, data update units or circuits 211-1 to 211-$n$, third non-successive decoding units or decoders 212-1 to 212-$n$, and second error detection units or detectors 213-1 to 213-$n$, where n is an integer representing the number of the data update units, of the third non-successive decoding units, and of the second error detection units, and means, for example, the number of lists in successive cancellation list decoding as described later. The example of FIG. 6 assumes that n is greater than or equal to three. However, the value of n is not limited to this example, and may be any number greater than or equal to one.

In this example, the first non-successive decoding unit 200 of the hard decision decoding unit 20 generates a hard decision value using a method adapted to the input signal, then performs, on the hard decision value, non-successive decoding of polar codes such as the operation described in the first embodiment, and outputs a decoding result to the replacement unit 201. The replacement unit 201 replaces a value at a bit position assigned to the fixed value with the fixed value in the decoding result outputted from the first non-successive decoding unit 200, and outputs the decoding result obtained after the replacement to the second non-successive decoding unit 202. The second non-successive decoding unit 202 performs non-successive decoding of polar codes on the decoding result outputted from the replacement unit 201, and outputs a decoding result to the data selection unit 23 and to the first error detection unit 203.

That is, in the present embodiment, the hard decision decoding unit 20 generates a third decoding result by performing hard decision decoding of polar codes on the input signal, replaces the value at the bit position assigned to the fixed value in the third decoding result with the fixed value, and generates a first decoding result by performing hard decision decoding of polar codes on the decoding result obtained by the replacement with the fixed value. The first decoding result is inputted to the data selection unit 23 similarly to the first embodiment.

The first error detection unit 203 performs error detection processing on the decoding result outputted from the second non-successive decoding unit 202, and outputs an error detection result to the control unit 22 and to the data selection unit 23. The first error detection unit 203 operates similarly to the first error detection unit 101 of the first embodiment.

The soft decision decoding unit 21 performs successive decoding of systematic polar codes on the input signal inputted to the decoding circuit 2. The successive decoding unit 210 of the soft decision decoding unit 21 performs successive decoding using the input signal and a decoding result obtained during the decoding operation of the successive decoding unit 210. The successive decoding unit 210 may use a decoding method such as, but not limited to, successive cancellation decoding and successive cancellation list decoding similarly to the first embodiment. The successive decoding unit 210 outputs, at a timing of completion of decoding, a result of successive decoding obtained in the process of the decoding operation, to the data update units 211-1 to 211-$n$. The successive decoding unit 210 also outputs, similarly to the successive decoding unit 110 of the first embodiment, information indicating the most probable candidate to the data selection unit 23. Note that FIG. 6 illustrates, by way of example, an example of use of successive cancellation list decoding, but as described in the first embodiment, the configuration in a case of the number of lists being one is similar to the configuration of an example using successive cancellation decoding, and the configuration illustrated in FIG. 6 is applicable also to the case of use of successive cancellation decoding.

The data update units 211-1 to 211-$n$ hold the decoding results inputted from the replacement unit 201 of the hard decision decoding unit 20, and overwrite the decoding results held therein, with the respective decoding results inputted from the successive decoding unit 210, which are results obtained in the process of the decoding, so as to update the decoding results. The data update units 211-1 to 211-$n$ output the updated decoding results to the third non-successive decoding units 212-1 to 212-$n$, respectively.

The third non-successive decoding units 212-1 to 212-$n$ perform non-successive decoding on the decoding results inputted from the data update units 211-1 to 211-$n$, and output decoding results to the second error detection units 213-1 to 213-$n$, respectively. The third non-successive decoding units 212-1 to 212-$n$ output the decoding results also to the data selection unit 23. The second error detection units 213-1 to 213-$n$ perform error detection processing similarly to the first error detection unit 203, on the decoding results inputted from the third non-successive decoding units 212-1 to 212-$n$, and output error detection results to the data selection unit 23.

That is, in the present embodiment, the soft decision decoding unit 21 generates fourth decoding results by performing hard decision decoding of polar codes on the decoding results obtained by updating the decoding result from the replacement unit 201 with the second decoding results, and generates second error detection results by performing, by the second error detection units 213-1 to 213-$n$, error detection processing on the fourth decoding results.

The control unit 22 controls the soft decision decoding unit 21 based on the error detection result inputted from the first error detection unit 203 of the hard decision decoding unit 20 and the control information inputted from the data selection unit 23. Specifically, in a case in which the error detection result inputted from the first error detection unit 203 is a result indicating occurrence of an error, the control unit 22 starts up the soft decision decoding unit 21. In contrast, upon input of information indicating that a decoding result has been determined as control information from the data selection unit 23, the control unit 22 stops the soft decision decoding unit 21. Note that, as also described in the first embodiment, the hard decision decoding unit 20 and the soft decision decoding unit 21 may be simultaneously started and operated to perform processings in parallel. In this case, the hard decision decoding unit 20 will complete the processing earlier than the soft decision decoding unit 21. Therefore, if no error has been detected during the error detection operation by the first error detection unit 203, stopping the soft decision decoding unit 21 is enough.

The data selection unit 23 generates control information based on pieces of information inputted from the hard decision decoding unit 20 and pieces of information inputted from the soft decision decoding unit 21, and outputs the control information to the control unit 22. In addition, the data selection unit 23 selects a decoding result to be used as the final decoding result based on the pieces of information inputted from the hard decision decoding unit 20 and the pieces of information inputted from the soft decision decoding unit 21, and outputs the final decoding result to a circuit, not illustrated, downstream of the decoding circuit 2.

More specifically, when the error detection result inputted from the first error detection unit 203 is a result indicating absence of error, the data selection unit 23 selects the decoding result outputted from the second non-successive decoding unit 202 of the hard decision decoding unit 20, and outputs that decoding result as the final decoding result. When the error detection result inputted from the first error detection unit 203 is a result indicating occurrence of an error, the data selection unit 23 selects a decoding result to be used as the final decoding result using the information inputted from the soft decision decoding unit 21, and outputs the final decoding result. Specifically, the data selection unit 23 selects, from among the decoding results inputted from the third non-successive decoding units 212-1 to 212-$n$, one indicating that the error detection result inputted from the second error detection units 213-1 to 213-$n$ has no error.

Otherwise, when all of the error detection results inputted from the second error detection units 213-1 to 213-$n$ indicate presence of an error, the data selection unit 23 selects the most probable decoding result from among the decoding results inputted from the third non-successive decoding units 212-1 to 212-$n$, using the information for selecting the most probable candidate inputted from the successive decoding unit 210, and outputs the most probable decoding result as the final decoding result.

Figure 7:
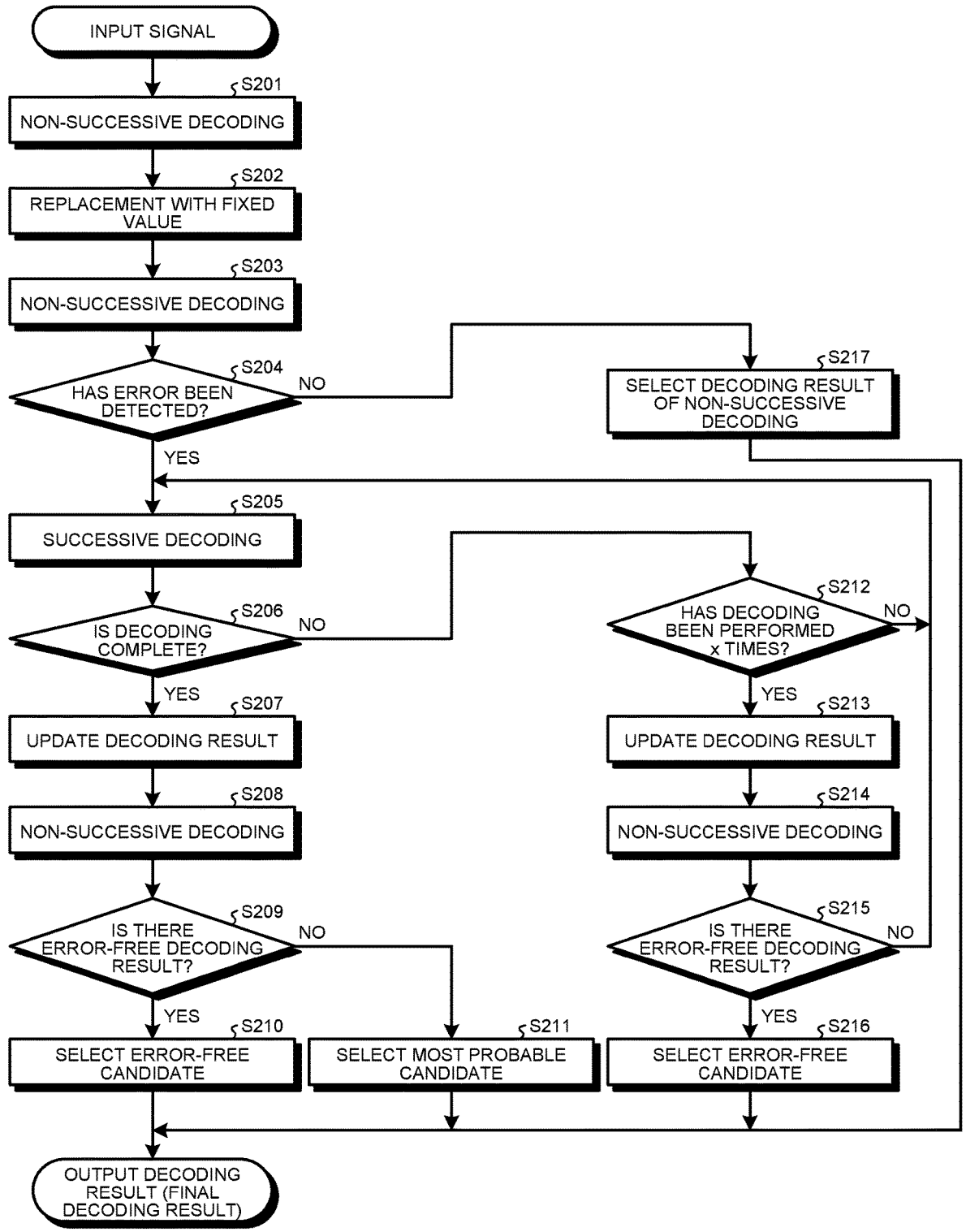
FIG. 7 is a flowchart illustrating an example of processing procedure in a decoding circuit of the second embodiment.

An operation of the decoding circuit 2 of the present embodiment will next be described with reference to a flowchart. FIG. 7 is a flowchart illustrating an example of processing procedure in the decoding circuit 2 of the present embodiment. Description of portions overlapping with corresponding portions of the first embodiment will be omitted. A case will be described below as an example in which successive cancellation list decoding is used as the successive decoding method.

First, when an input signal is inputted into the decoding circuit 2, the first non-successive decoding unit 200 of the hard decision decoding unit 20 performs non-successive decoding (step S201). As described above, the first non-successive decoding unit 200 outputs a decoding result to the replacement unit 201. The replacement unit 201 replaces a value at the bit position assigned to the fixed value with the fixed value in the decoding result inputted from the first non-successive decoding unit 200 (step S202). The replacement unit 201 outputs the decoding result obtained after the replacement with the fixed value to the second non-successive decoding unit 202. The second non-successive decoding unit 202 performs non-successive decoding on the decoding result inputted from the replacement unit 201 (step S203). The second non-successive decoding unit 202 outputs the decoding result to the data selection unit 23 and to the first error detection unit 203. The first error detection unit 203 performs error detection processing, and outputs an error detection result to the data selection unit 23 and to the control unit 22.

The data selection unit 23 determines whether or not an error has been detected based on the error detection result (step S204). If no error has been detected (No at step S204), the data selection unit 23 selects the decoding result inputted from the second non-successive decoding unit 202 as the final decoding result (step S217). The data selection unit 23 then outputs the final decoding result. Upon completion of the determination of the decoding result, that is, upon outputting of the final decoding result, the data selection unit 23 provides the control unit 22 with information indicating that the decoding result has been determined, as control information, so as to make notification to the unit 22. Upon reception of this notification, the control unit 22 stops the soft decision decoding unit 21.

If the error detection result inputted from the first error detection unit 203 indicates that an error has been detected (Yes at step S204), the successive decoding unit 210 performs successive decoding (step S205). The successive decoding unit 210 generates as many decoding results as the number of lists by successive decoding, and generates pieces of information for selecting the most probable candidate as many as the number of lists. The successive decoding unit 210 outputs decoding results for the number of lists to the data update units 211-1 to 211-$n$, respectively, and outputs the pieces of information for selecting the most probable candidate as many as the number of lists, to the data selection unit 23.

The successive decoding unit 210 determines whether the decoding is completed, i.e., whether or not the decoding has been performed as many as the length of code (step S206). If the decoding is completed (Yes at step S206), the successive decoding unit 210 instructs the data update units 211-1 through 211-$n$ to update the respective decoding results, and the data update units 211-1 to 211-$n$ update the respective decoding results (step S207). Specifically, the data update units 211-1 to 211-$n$ overwrite the respective decoding results held therein, with the respective decoding results inputted from the successive decoding unit 210 to thereby update the decoding results. The data update units 211-1 to 211-$n$ output the updated decoding results to the third non-successive decoding units 212-1 to 212-$n$.

The third non-successive decoding units 212-1 to 212-$n$ perform non-successive decoding on the decoding results inputted from the data update units 211-1 to 211-$n$ (step S208). The third non-successive decoding units 212-1 to 212-$n$ output the decoding results of the non-successive decoding to the respective second error detection units 213-1 to 213-$n$ and to the data selection unit 23.

The data selection unit 23 determines whether or not there is an error-free decoding result of the decoding results inputted from the third non-successive decoding units 212-1 to 212-$n$, on the basis of the error detection results inputted from the second error detection units 213-1 to 213-$n$ (step S209). If there is an error-free decoding result (Yes at step S209), the data selection unit 23 selects, as the final decoding result, the error-free candidate, i.e., the decoding result determined to be error-free in the error detection results, from among the decoding results inputted from the third non-successive decoding units 212-1 to 212-$n$ (step S210), and outputs the final decoding result.

If there is no error-free decoding result (No at step S209), the data selection unit 23 selects a likely candidate as the final decoding result based on the information for selecting the most probable candidate inputted from the successive decoding unit 210 (step S211), and outputs the likely candidate as the final decoding result.

If the decoding is not yet completed at step S206 (No at step S206), the successive decoding unit 210 determines whether or not the decoding has been performed x times (step S212). This x is similar to that in the first embodiment. If the successive decoding unit 210 has performed the decoding less than x times, that is, when the unit 210 has not yet performed the decoding x times (No at step S212), the successive decoding unit 210 performs the process from step S205 again.

Meanwhile, if the decoding has been performed x times (Yes at step S212), the successive decoding unit 210 instructs the data update units 211-1 through 211-$n$ to update the decoding results, and the operations of steps S213, S214, and S215 are performed similarly to the operations of steps S207, S208, and S209.

If there is an error-free decoding result (Yes at step S215), the data selection unit 23 selects, as the final decoding result, the error-free candidate, i.e., the decoding result determined to be error-free in the error detection results, from among the decoding results inputted from the third non-successive decoding units 212-1 to 212-$n$ (step S216), and outputs the final decoding result. If there is no error-free decoding result (No at step S215), the successive decoding unit 210 performs the process from step S205 again.

Similarly to the first embodiment, successive cancellation list decoding for which the number of lists is set to one is equivalent to successive cancellation decoding, and in such a case the processing procedure of FIG. 7 is also applicable to a case of use of successive cancellation decoding. In addition, when the number of lists is 1, the processes of steps S209, S210, S211, and S216 of FIG. 7 may be omitted.

In the decoding method of the present embodiment, the first step generates a third decoding result by performing hard decision decoding of polar codes on the input signal, replaces a value at the bit position assigned to the fixed value with the fixed value in encoding of the third decoding result, and generates the first decoding result by performing hard decision decoding of polar codes on the decoding result obtained by the replacement with the fixed value. In addition, the second step generates a fourth decoding result by performing hard decision decoding of polar codes on a result obtained by updating the decoding result obtained by the replacement with the fixed value in the third decoding result using the second decoding result, and generates the second error detection result by performing error detection processing on the fourth decoding result.

A hardware configuration for implementing the decoding circuit 2 of the present embodiment will next be described. The units constituting each of the hard decision decoding unit 20 and the soft decision decoding unit 21, the control unit 22, and the data selection unit 23 of the decoding circuit 2 can be implemented similarly to the units of the decoding circuit 1 of the first embodiment by the processing circuit that is the dedicated hardware set illustrated in FIG. 4. In addition, the units constituting each of the hard decision decoding unit 20 and the soft decision decoding unit 21, the control unit 22, and the data selection unit 23 of the decoding circuit 2 may also be implemented similarly to the units of the decoding circuit 1 of the first embodiment by the control circuit illustrated in FIG. 5. In a case in which the units constituting each of the hard decision decoding unit 20 and the soft decision decoding unit 21, the control unit 22, and the data selection unit 23 of the decoding circuit 2 are implemented by the control circuit illustrated in FIG. 5, these units can be implemented, similarly to the first embodiment, by software, firmware, or a combination of software and firmware. A concrete manner of implementing each function thereof is similar to that in the first embodiment. Similarly to the case of the first embodiment, the decoding circuit 2 can be implemented in dedicated hardware, software, firmware, or a combination thereof.

As described above, in the present embodiment, it is possible to promptly terminate the decoding processing when an error-free result is detected at any intermediate point of the processing when decoding is not yet completed for the length of code, similarly to the first embodiment. This can prevent or minimize redundant operation, and can thus reduce the operational rate of the decoding circuit 2.

Third Embodiment

Figure 8:
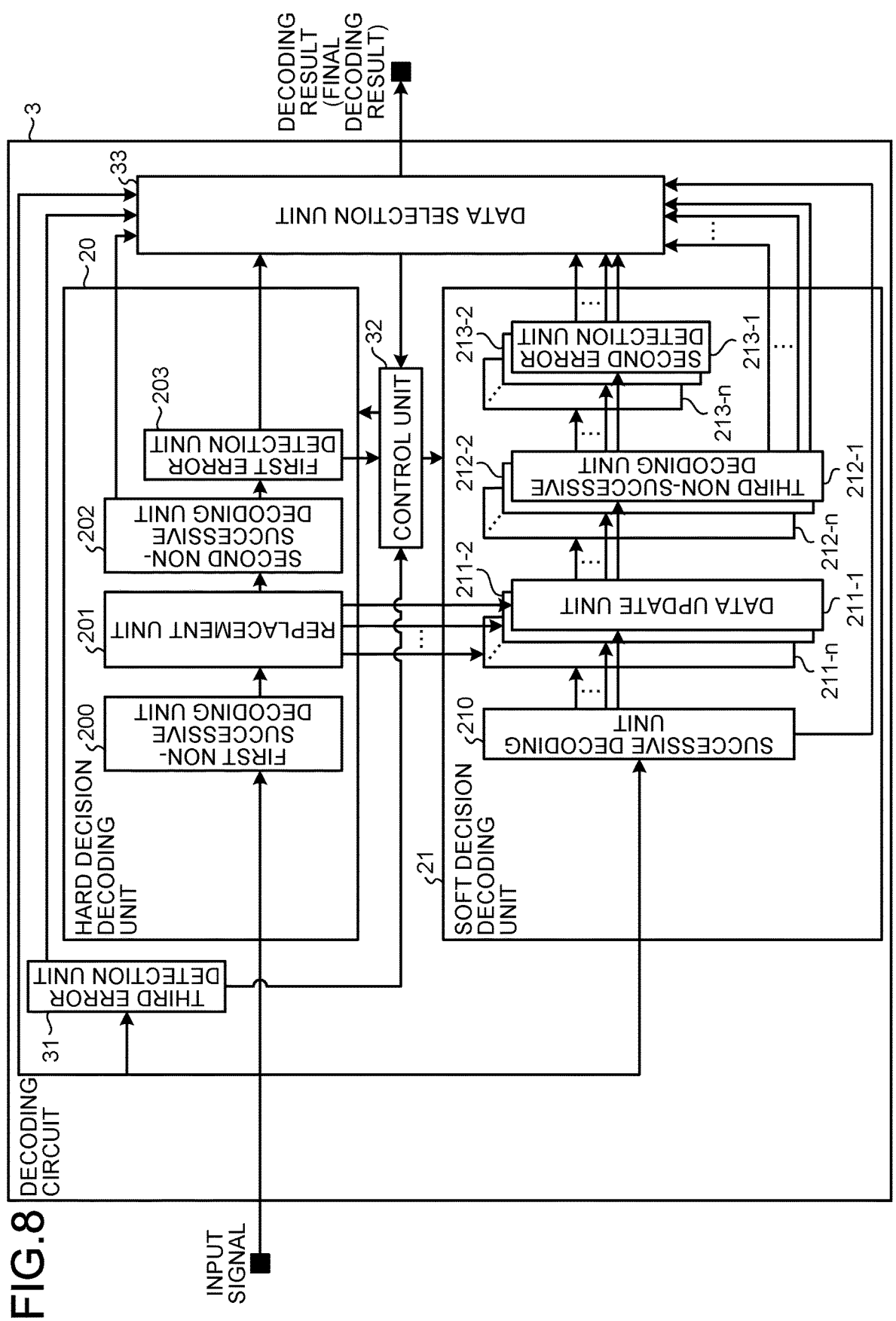
FIG. 8 is a diagram illustrating an example configuration of a decoding circuit according to a third embodiment.

FIG. 8 is a diagram illustrating an example configuration of a decoding circuit according to a third embodiment of the present disclosure. In the present embodiment, encoding is performed on systematic polar codes to which a redundancy bit is added so as to make error detection in the transmission signal. As illustrated in FIG. 8, a decoding circuit 3 is an example of a decoding device according to the present disclosure. Similarly to the decoding circuits 1 and 2 of the first and second embodiments, the decoding circuit 3 decodes a signal that has been inputted therein, and outputs a result obtained by the decoding to a downstream circuit not illustrated. Note that also in the present embodiment, the decoding result to be outputted to the downstream circuit is called as final decoding result. The input signal in the present embodiment is similar to the input signal in the second embodiment. Redundant description of the same parts as those of the second embodiment will be omitted below, and differences from the second embodiment will primarily be described.

As illustrated in FIG. 8, the decoding circuit 3 includes the hard decision decoding unit 20, the soft decision decoding unit 21, a third error detection unit or detector 31, a control unit or controller 32, and a data selection unit or selector 33. The hard decision decoding unit 20 and the soft decision decoding unit 21 are similar to those of the second embodiment, and description thereof will therefore be omitted.

The third error detection unit 31 performs hard decision on the input signal, performs error detection processing on the hard decision result, and thus outputs an error detection result that is a third error detection result to the control unit 32 and to the data selection unit 33. The control unit 32 has a similar function to the function of the control unit 22 of the second embodiment, and also performs processing such as processing according to the error detection result inputted from the third error detection unit 31. The data selection unit 33 has a similar function to the function of the data selection unit 23 of the second embodiment, and also performs processing such as processing according to the error detection result inputted from the third error detection unit 31.

When a determination is made that there is an error based on the error detection result inputted from the third error detection unit 31, the control unit 32 starts up the hard decision decoding unit 20. In addition, when control information from the data selection unit 33 indicates that the data selection unit 33 has determined the decoding result, the control unit 32 stops the hard decision decoding unit 20 and the soft decision decoding unit 21. The other operations of the control unit 32 are similar to the corresponding operations of the control unit 22 of the second embodiment.

When a determination is made that there is no error based on the error detection result inputted from the third error detection unit 31, the data selection unit 33 selects, as the final decoding result, the result of the hard decision performed on the input signal inputted to the decoding circuit 3, and outputs the final decoding result. When a determination is made that there is an error, the data selection unit 33 outputs control information indicating presence of an error to the control unit 32. In addition, after selecting and outputting the final decoding result, the data selection unit 33 outputs, similarly to the first and second embodiments, the control information indicating that the decoding result has been determined to the control unit 32. The other operations of the data selection unit 33 are similar to the corresponding operations of the data selection unit 23 of the second embodiment.

Figure 9:
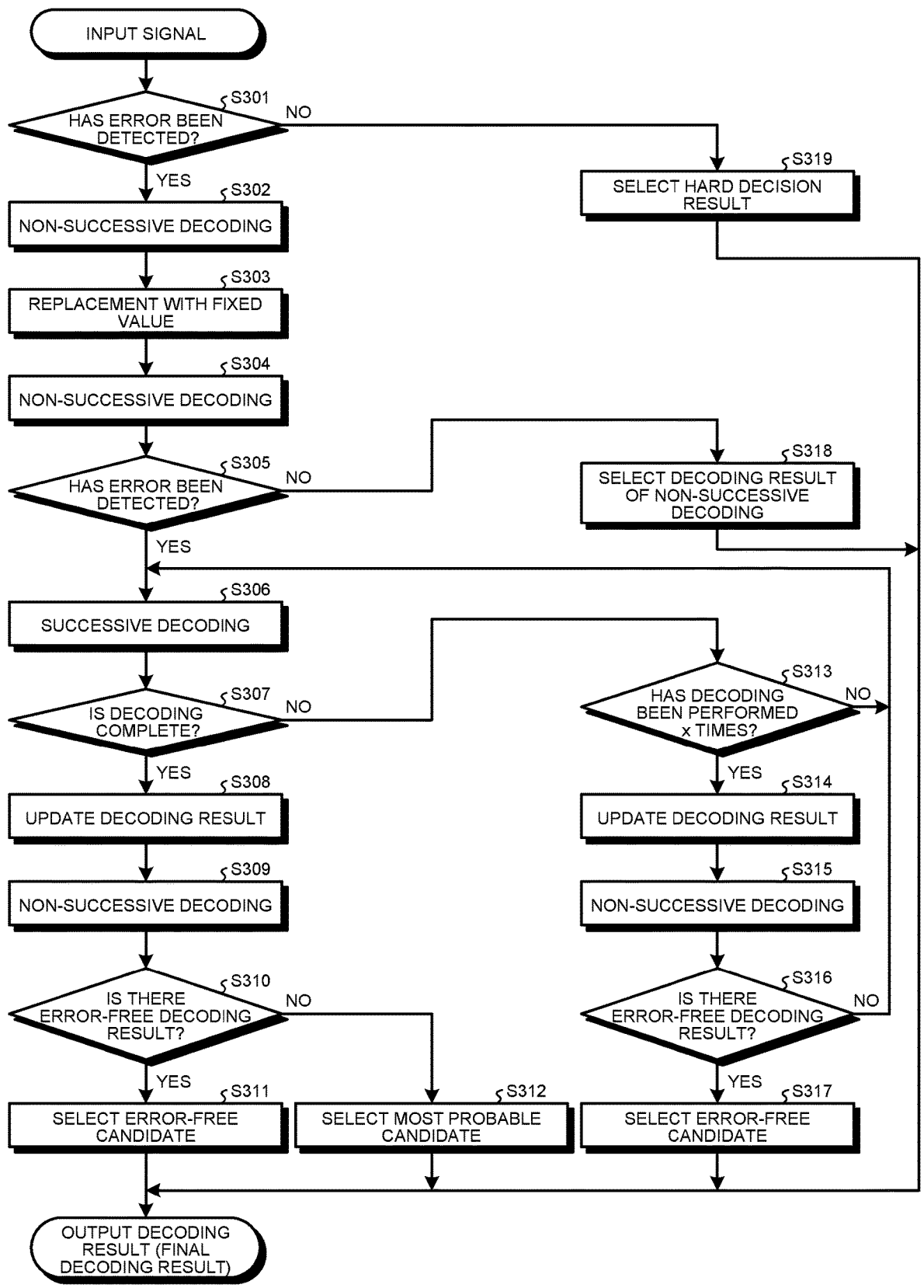
FIG. 9 is a flowchart illustrating an example of processing procedure in a decoding circuit of the third embodiment.

An operation of the decoding circuit 3 of the present embodiment will next be described with reference to a flowchart. FIG. 9 is a flowchart illustrating an example of processing procedure in the decoding circuit 3 of the present embodiment. Description of portions overlapping with corresponding portions of the second embodiment will be omitted. A case will be described below as an example in which successive cancellation list decoding is used as the successive decoding method.

First, when an input signal is inputted into the decoding circuit 3, the third error detection unit 31 performs hard decision on the input signal, and performs error detection processing on the result of the hard decision. The third error detection unit 31 outputs an error detection result to the control unit 32 and to the data selection unit 33. The data selection unit 33 determines whether or not there is an error, based on the error detection result inputted from the third error detection unit 31 (step S301). If there is no error (No at step S301), the data selection unit 33 selects, as the final decoding result, the hard decision result of the soft decision value of the reception signal or of the LLR, inputted to the decoding circuit 3 (step S319), and outputs the final decoding result. Upon completion of the determination of the decoding result, that is, upon outputting of the final decoding result, the data selection unit 33 provides the control unit 32 with notification, as control information, of information indicating that the decoding result has been determined, similarly to the second embodiment. Upon reception of this notification, the control unit 32 stops the hard decision decoding unit 20 and the soft decision decoding unit 21.

If there is an error (Yes at step S301), hard decision decoding is performed similarly to the second embodiment, and soft decision decoding is then performed according to the result thereof. The operations at steps S302 to S318 illustrated in FIG. 9 are similar to the operations at steps S201 to S217 of the second embodiment, and description thereof will therefore be omitted.

As described above, the decoding circuit 3 of the present embodiment is configured such that the third error detection unit 31 performs hard decision on an input signal, and performs error detection processing on the result of the hard decision. The decoding circuit 3 of the present embodiment is also configured, when the error detection result of the error detection processing performed by the third error detection unit 31 indicates absence of error, not to activate the hard decision decoding unit 20 and the soft decision decoding unit 21, but to output the hard decision result as the final decoding result. In the present embodiment, this can provide an advantage similar to the advantage of the second embodiment, and in addition, can further reduce the amount of operation of the decoding circuit 3, and can further reduce the operational rate of the decoding circuit 3, as compared to the second embodiment.

A decoding device according to the present disclosure provides an advantageous effect in that the total amount of decoding operation can be reduced.

The configurations described in the foregoing embodiments are merely examples of contents of the present disclosure, and can each be combined with other publicly known techniques and partially omitted and/or modified without departing from the scope of the present disclosure.

What is claimed is:

1. A decoding device comprising:
   a hard decision decoder to generate a first decoding result by performing hard decision decoding of a polar code using an input signal, and to generate a first error detection result by performing first error detection processing on the first decoding result;
   a soft decision decoder to generate a second decoding result by performing successive decoding of a polar code on the input signal, the second decoding result being obtained for each decoding step in the successive decoding, and to generate a second error detection result by performing second error detection processing on a result obtained by updating the first decoding result using the second decoding result;
   a data selector to select either the first decoding result or the result obtained by updating the first decoding result using the second decoding result, and to output a selection result as a final decoding result; and
   a controller to stop the soft decision decoder when the data selector outputs the final decoding result.

2. The decoding device according to claim 1, wherein when the first error detection result is a result indicating absence of error, the data selector selects and outputs the first decoding result.

3. The decoding device according to claim 1, wherein when the first error detection result is a result indicating presence of an error, the controller starts up the soft decision decoder.

4. The decoding device according to claim 1, wherein
   the soft decision decoder performs the second error detection processing before completion of the successive decoding for a length of code,
   the data selector determines whether or not the second error detection result is a result indicating absence of error, and if the second error detection result is a result indicating absence of error, selects a result obtained by updating the first decoding result using the second decoding result corresponding to the second error detection result, and outputs a selection result as the final decoding result, and
   the controller stops the soft decision decoder when the data selector outputs the result obtained by updating the first decoding result using the second decoding result, as the final decoding result.

5. The decoding device according to claim 4, wherein the soft decision decoder performs the second error detection processing when the number of times of decoding in the successive decoding reaches a predetermined number of times.

6. The decoding device according to claim 1, wherein
   the successive decoding is successive cancellation list decoding, the soft decision decoder generates a result obtained by updating the first decoding result using the second decoding result for each list, and the second error detection result, and the data selector selects and outputs, based on the second error detection result, a result obtained by updating the first decoding result using one of the second decoding results, from among the results obtained by updating the first decoding result using the second decoding result for each list.

7. The decoding device according to claim 6, wherein the soft decision decoder generates information representing likeliness associated with the second decoding result for each list, and when there is no result indicating absence of error among the second error detection results, the data selector selects and outputs, based on the information representing likeliness, a result obtained by updating the first decoding result using one of the second decoding results, from among the results obtained by updating the first decoding result using the second decoding result for each list.

8. The decoding device according to claim 1, wherein the polar code is a systematic polar code, the hard decision decoder generates a third decoding result by performing hard decision decoding of a polar code on the input signal, replaces a value at a bit position assigned to a fixed value in encoding of the third decoding result with the fixed value, and generates the first decoding result by performing hard decision decoding of a polar code on a decoding result obtained by replacement with the fixed value, and the soft decision decoder generates a fourth decoding result by performing hard decision decoding of a polar code on a result obtained by updating, using the second decoding result, of the decoding result obtained by replacement with the fixed value in the third decoding result, and generates the second error detection result by performing error detection processing on the fourth decoding result.

9. The decoding device according to claim 1, comprising:

an error detector to generate a hard decision result by performing hard decision on the input signal, and to generate a third error detection result by performing error detection processing on the hard decision result, wherein the controller starts up the hard decision decoder based on the third error detection result.

10. The decoding device according to claim 9, wherein the data selector selects and outputs the hard decision result when the third error detection result is a result indicating absence of error.

11. A decoding method in a decoding device that decodes a polar code, the decoding method comprising:

a first step of performing a first process to generate a first decoding result by performing hard decision decoding of a polar code using an input signal, and to generate a first error detection result by performing error detection processing on the first decoding result;

a second step of performing a second process to generate a second decoding result by performing successive decoding of a polar code on the input signal, the second decoding result being obtained for each decoding step in the successive decoding, and to generate a second error detection result by performing error detection processing on a result obtained by updating the first decoding result using the second decoding result;

a third step of selecting either the first decoding result or a decoding result obtained by updating of the first decoding result with the second decoding result, and outputting a selection result as a final decoding result; and a fourth step of stopping the second process when the final decoding result is outputted in the third step.

12. The decoding method according to claim 11, wherein the polar code is a systematic polar code, in the first step, a third decoding result is generated by performing hard decision decoding of a polar code on the input signal, a value at a bit position assigned to a fixed value in encoding of the third decoding result is replaced with the fixed value, and the first decoding result is generated by performing hard decision decoding of a polar code on a decoding result obtained by replacement with the fixed value, and in the second step, a fourth decoding result is generated by performing hard decision decoding of a polar code on a result obtained by updating, using the second decoding result, of the decoding result obtained by replacement with the fixed value in the third decoding result, and the second error detection result is generated by performing error detection processing on the fourth decoding result.

13. A control circuit to control a decoding device, the control circuit causing the decoding device to perform:

a first step of performing a first process to generate a first decoding result by performing hard decision decoding of a polar code using an input signal, and to generate a first error detection result by performing error detection processing on the first decoding result;

a second step of performing a second process to generate a second decoding result by performing successive decoding of a polar code on the input signal, the second decoding result being obtained for each decoding step in the successive decoding, and to generate a second error detection result by performing error detection processing on a result obtained by updating the first decoding result using the second decoding result;

a third step of selecting either the first decoding result or a decoding result obtained by updating of the first decoding result with the second decoding result, and outputting a selection result as a final decoding result; and a fourth step of stopping the second process when the final decoding result is outputted in the third step.

14. A non-transitory storage medium in which a program configured to control a decoding device is stored, the program causing the decoding device to execute:

a first step of performing a first process to generate a first decoding result by performing hard decision decoding of a polar code using an input signal, and to generate a first error detection result by performing error detection processing on the first decoding result;

a second step of performing a second process to generate a second decoding result by performing successive decoding of a polar code on the input signal, the second decoding result being obtained for each decoding step in the successive decoding, and to generate a second error detection result by performing error detection processing on a result obtained by updating the first decoding result using the second decoding result;

a third step of selecting either the first decoding result or a decoding result obtained by updating of the first decoding result with the second decoding result, and outputting a selection result as a final decoding result; and a fourth step of stopping the second process when the final decoding result is outputted in the third step.

* * * * *